United States Patent [19]
Bhat

[11] Patent Number: 5,589,422
[45] Date of Patent: Dec. 31, 1996

[54] CONTROLLED, GAS PHASE PROCESS FOR REMOVAL OF TRACE METAL CONTAMINATION AND FOR REMOVAL OF A SEMICONDUCTOR LAYER

[75] Inventor: Suresh A. Bhat, Fremont, Calif.

[73] Assignee: Intel Corporation, Santa Clara, Calif.

[21] Appl. No.: 5,475

[22] Filed: Jan. 15, 1993

[51] Int. Cl.$^6$ .......................... H01L 21/311; H01L 21/316
[52] U.S. Cl. .......................... 437/228; 437/239; 437/946; 134/1.3; 156/646.1
[58] Field of Search .................................... 437/225, 228, 437/239, 946; 148/DIG. 17, DIG. 135; 156/646, 646.1; 134/1.2, 1.3

[56] References Cited

U.S. PATENT DOCUMENTS

| | | | |
|---|---|---|---|
| 3,711,324 | 1/1973 | Glendinning et al. | 117/201 |
| 3,773,578 | 11/1973 | Glendinning et al. | 156/17 |
| 4,375,125 | 3/1983 | Byatt | 29/588 |
| 5,028,560 | 7/1991 | Tsukamoto et al. | 437/239 |
| 5,098,866 | 3/1992 | Clark et al. | 437/239 |
| 5,169,408 | 12/1992 | Biggerstaff | 156/646 |
| 5,238,871 | 8/1993 | Seto | 437/186 |
| 5,240,554 | 8/1993 | Hori et al. | 156/643 |
| 5,294,568 | 3/1994 | McNeilly et al. | 437/235 |
| 5,294,571 | 3/1994 | Fujishiro et al. | 437/239 |
| 5,302,240 | 4/1994 | Hori et al. | 156/643 |
| 5,380,555 | 1/1995 | Mine et al. | 427/226 |
| 5,443,863 | 8/1995 | Neely et al. | 427/579 |

OTHER PUBLICATIONS

IBM Tech. Discl. Bull., Removal of Contamination Left From Reactive Ion Etching of Si Wafers Without Simultaneous Oxide Growth, vol. 33, No. 5, Oct. 1990, p. 269.

B. E. Deal, M. A. McNeilly, D. B. Kao, J. M. deLarios. "Vapor Phase Wafer Cleaning: Processing for the 1990s" *Solid State Technology* pp. 73–77, Jul. 1990.

M. Wong, D. Liu, M. Moslehi, Member, IEEE, D. Reed. "Preoxidation Treatment Using HCl/HF Vapor" *IEEE Electron Device Letters* vol. 12, pp. 425–426, Aug. 1991.

M. Wong, M. Moslehi, and D. Reed. "Characterization of Wafer Cleaning and Oxide Etching Using Vapor–Phase Hydrogen Fluoride" *Journal of Electrochemical Society, Inc.* vol. 138, pp. 1799–1802, Jun. 1991.

M. Miyashita, M. Itano, T. Imaoka, I. Kawanabe and T. Ohmi. "Dependence of Thin Oxide Films Quality on Surface Micro–Roughness" *1991 Symposium on VLSI Technology: Digest of Technical Papers* pp. 45,46, 1991.

W. Kern. "The Evolution of Silicon Wafer Cleaning Technology" *Journal of Electrochemical Society, Inc.* vol. 137, pp. 1887–1892, Jun. 1990.

Primary Examiner—R. Bruce Breneman
Assistant Examiner—Matt Whipple
Attorney, Agent, or Firm—Blakely, Sokoloff, Taylor & Zafman

[57] ABSTRACT

A ultra-clean, ULSI-supportable process is described for cleaning and etching very thin layers of a semiconductor surface in a gaseous ambient at approximately room temperature. An oxidized surface is etched and cleaned in the vapors of azeotropic, aqueous acids. The cleaning properties of the vapors of the aqueous acids are such that metallic contaminants residing at the surface or within the oxidized layer are complexed and later rinsed away in a rinsing process. The surface is then re-oxidized in an ozone ambient, the resultant oxidation reaction being self-limiting such that the oxide layer is grown to a consistent, predetermined thickness. The process may be repeated any number of times depending on the depth at which any contaminants reside.

29 Claims, 8 Drawing Sheets

CONTROLLED, GAS PHASE PROCESS FOR REMOVAL OF TRACE METAL CONTAMINATION AND FOR REMOVAL OF A SEMICONDUCTOR LAYER

BACKGROUND OF THE INVENTION

1. Field of the Invention

The present invention relates to semiconductor processing, and more particularly to gas and vapor phase cleaning and etching of semiconductor surfaces.

2. Background Information

During the manufacture of semiconductor circuitry, impurities are either purposefully or inadvertently introduced to the semiconductor material. Undesired impurities, also called contamination or microcontamination, may ultimately cause semiconductor device failure. These failures, if occurring at the consumer level, may result in anything from unreliable electronic fuel injection systems to inoperative computer work stations. It is therefore necessary to remove microcontamination from semiconductor substrates during the manufacturing process.

As semiconductor device sizes shrink, the importance of semiconductor substrate cleanliness increases. For example, if a semiconductor transistor has dimensions on the order of 10 microns, as was common about a decade ago, the effect of a 1 micron wide contaminant would not significantly impact the performance of that transistor because the contaminant could only affect a small portion of the total transistor's area. However, if a semiconductor transistor has dimensions on the order of 1 micron or below, as is common today, the same 1 micron wide contaminant could lead to catastrophic failure of that transistor. Extrapolating, it can be seen that high density very-large-scale (VLSI) and ultra-large-scale (ULSI) integrated circuits (IC's), circuits with dimensions below 1 micron, require increasingly stringent levels of reduced microcontamination to achieve reliable device operation.

Metallic contamination, including ionic and elemental impurities, represents a notable threat to the maintenance of strict microcontamination control. This type of microcontamination usually manifests itself as either a surface film, or, if absorbed into the semiconductor substrate, a sub-surface impurity. If metallic contaminants are not removed from semiconductor substrates during the IC manufacturing process, it is likely that the impurities will degrade or inhibit the proper electrical performance and life span of the semiconductor IC's thus increasing the costs while decreasing the quality of consumer electronics.

The RCA clean is the most pervasive and well established silicon substrate cleaning method within the industry today. It consists of two chemical treatments known as SC-1 and SC-2. SC-1 is a basic solution consisting of $H_2O$, $H_2O_2$, and $NH_4OH$. SC-2 is an acidic solution consisting of $H_2O$, $H_2O_2$, and HCL. The $NH_4OH$ serves to complex several types of metallic contaminants which are then dissolved into the SC-1 solution. SC-2 then removes alkali ions, cations, and some additional metallic contaminants. Variations on the standard SC-1/SC-2 cleaning method have been developed and automated. Some alternate chemical sequences are SC-1/SC-2/HF, SC-1/HF/SC-2, and $H_2SO_4$-$H_2O_2$/SC-1/HF/SC-2. The RCA cleaning method has proven to be effective in the removal of many species of surface contaminants.

There are several disadvantages, however, to using the RCA cleaning method. One of the main drawbacks is that while the method is useful for removing some forms of microcontamination, other forms of microcontamination are inadvertently introduced to the substrate surface from the wet chemicals used. This is an inherent limitation when working with wet chemical cleaning processes. Even the purest wet chemicals contain significant amounts of contamination in comparison to gases and vapors. In fact, gases and vapors can be two to three orders of magnitude purer than their aqueous chemical counterparts. Incidentally, for the sake of clarity, the noun "gas" and its adjective "gaseous" shall hereinafter be used to additionally encompass the meaning of the noun "vapor" and its adjective "vaporous" respectively.

Another concern in using the RCA cleaning method is the massive amount of chemical waste produced by the wet bench immersion systems used in many automated processing environments. The volume of chemicals required to support these immersion systems adds to the manufacturing costs and poses a significant environmental concern. Automated centrifugal spray cleaning systems using the RCA cleaning method have been developed. These systems reduce the amount of chemical waste produced, but they tend to require considerable maintenance.

Strictly mechanical techniques for cleaning semiconductor substrates such as brush scrubbing, fluid jet, and ultrasonic techniques do little if anything to remove surface films and certainly do nothing to remove sub-surface impurities. These techniques are only useful in the removal of large particles from semiconductor substrate surfaces. In addition, the harsh nature of these mechanical techniques can easily lead to substrate damage.

Choline cleaning chemistry has been proposed as a replacement or modification to the standard RCA cleaning chemistry. Choline, a strong corrosive base consisting of trimethyl-2-hydroxyethyl ammonium hydroxide, appears to be suitable for removing several surface contaminants, particularly when used in place of the $NH_4OH$ in SC-1. However, as a wet chemical cleaning process, choline cleans suffer many of the same limitations as the RCA clean. One of the most significant limitations is that while some microcontamination is removed from the semiconductor substrate by the choline process, other forms of microcontamination are inadvertently introduced to the substrate surface from the wet chemicals used.

Some dry-cleaning techniques have been developed in order to exploit the purity of gases. One such technique, the $UV/CL_2$ process, involves using chlorine radicals produced under ultraviolet radiation. This process, however, requires high temperatures on the order of 150°–400° C. for successful removal of metal contaminants. Implementing these high temperatures complicates systems causing them to become more susceptible to breakdown, allows for surface and stub-surface contaminants to potentially diffuse further into the substrate, and contributes to the thermal budget of a process, which is of particular detriment for low thermal budget ULSI manufacturing. In addition, $UV/CL_2$ processes cannot adequately remove all metallic and ionic contaminants in the gas phase.

Other dry cleaning techniques, in an attempt to keep process temperatures low, typically require larger excitation energies in order to drive the necessary chemical reactions. These excitation energies are typically applied in the form of electromagnetic radiation (for instance, rf radiation to create a plasma). Radiation of this type can have serious detrimental effects on the electrical properties of semiconductor devices. For instance, dielectric breakdown and threshold voltage, shifts are not uncommon results of radiation damage.

These and other cleaning techniques using gas, vapor, or plasma ambients not only require high temperatures but also require very low pressures in order to vaporize the micro-contamination. The necessity for very low pressure ambients in such cleaning processes further adds to system cost and complexity as well as contributing to significant increases in throughput time.

Surface micro-roughness is a qualitative description of how rough a semiconductor surface is at the molecular level. There is a strong dependance of thin oxide film quality on the surface micro-roughness upon which the oxide is grown or deposited. Just as lateral dimensions shrink as we enter the ULSI era, so do processes layer thicknesses, particularly gate oxide thicknesses. As oxide layer thicknesses decrease, the oxide layers become more susceptible to electrical breakdown, so the quality and integrity of those layers, and hence the micro-roughness of the semiconductor surface, becomes of paramount importance. Therefore, it is important to consider the effects on surface micro-roughness when designing and implementing a semiconductor cleaning process. Any new semiconductor cleaning process must not significantly roughen the semiconductor surface when compared to the roughening caused by cleaning processes that are currently in use.

In the manufacture of semiconductor devices it is often necessary to implement reactive ion etching (RIE) processes in order to anisotropically etch semiconductor materials. Unfortunately, these processes can severely damage semiconductor surfaces. Typically, these damaged surfaces are removed by plasma etching of the semiconductor material. However, plasma based processes lack the control necessary to etch the semiconductor material to a consistent depth over shallow junctions. This results in unpredictable doping profiles which can cause device failure or significant batch to batch variation in device operation. It would be desirable for a semiconductor cleaning process to be able to remove any RIE damage to semiconductor surfaces with precision and accuracy while smoothing the semiconductor surface.

SUMMARY OF THE INVENTION

The surface of the semiconductor layer is first cleaned and stripped of any native oxide in an etchant ambient. The surface is then oxidized to a controlled thickness in an oxidizing ambient such as ozone. Next, the oxidized layer is etched in a gaseous ambient. The semiconductor layer may then be rinsed, dryed and the process repeated beginning with oxidation of the semiconductor surface. The process may be repeated any number of times depending on the depth of the contamination or the thickness of the semiconductor material that the user desires to be removed. This process is particularly useful in the fabrication of semiconductor circuits where the manifestation of contaminants or other crystalline defects at or near the surface of the semiconductor layer can have a detrimental effect on the performance of those circuits.

BRIEF DESCRIPTION OF THE DRAWINGS

The present invention is illustrated by way of example and not limitation in the figures of the accompanying in which like references indicate like elements and in which.

DETAILED DESCRIPTION

An ultra-clean, high precision process is described for not only etching very thin layers of semiconductor material but also removing contaminants from the surface and sub-surface of semiconductor layers. In the following description, numerous specific details such as layer thicknesses, process temperatures, etc., are set forth in order to provide a more thorough understanding of the present invention. It will be obvious, however, to one skilled in the art, that the present invention may be practiced without employing these specific details. In other instances, well-known processes have not been described in detail in order not to unnecessarily obscure the present invention.

Figure 1:
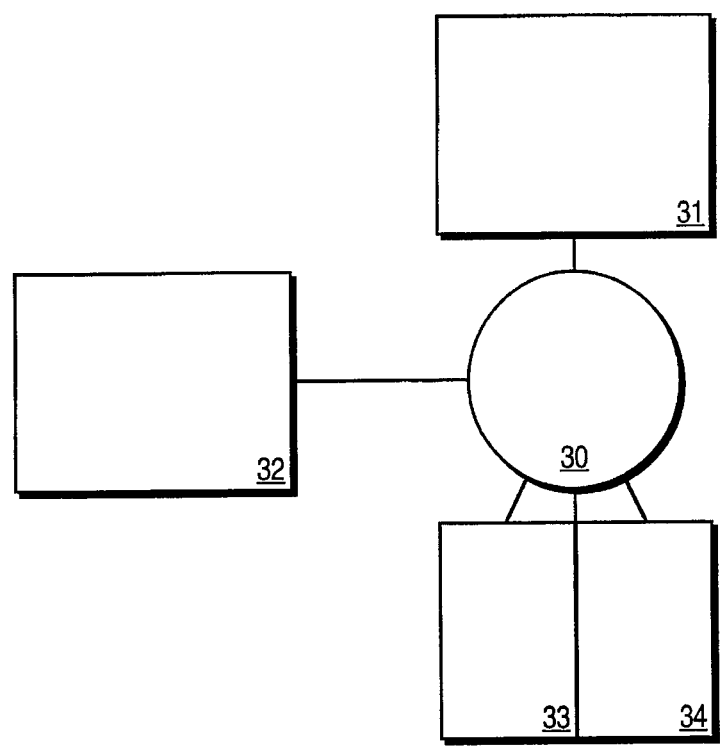
FIG. 1 illustrates a block diagram of a semiconductor cleaning apparatus designed to practice an embodiment the present invention.
Figure 2:
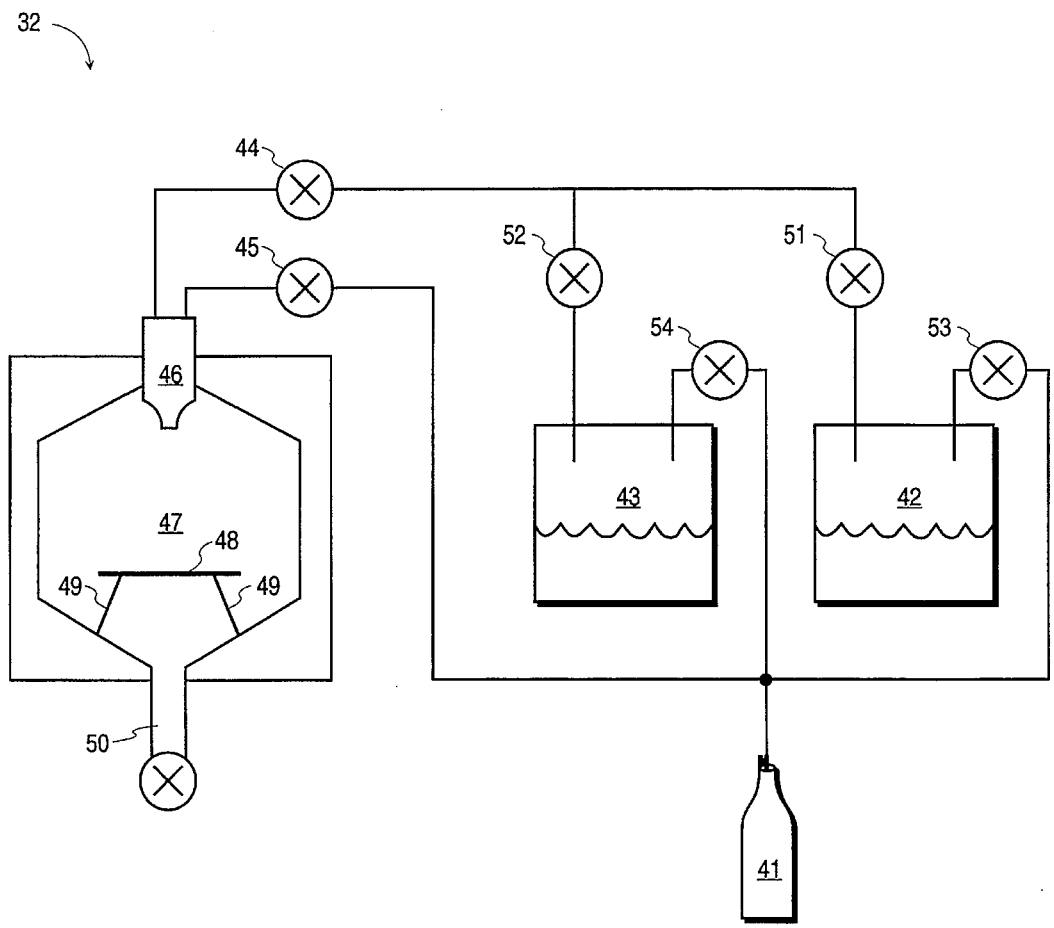
FIG. 2 provides a more detailed view of Block 32 of FIG. 1 including cross-sectional views of a process chamber and two vaporizers.
Figure 3:
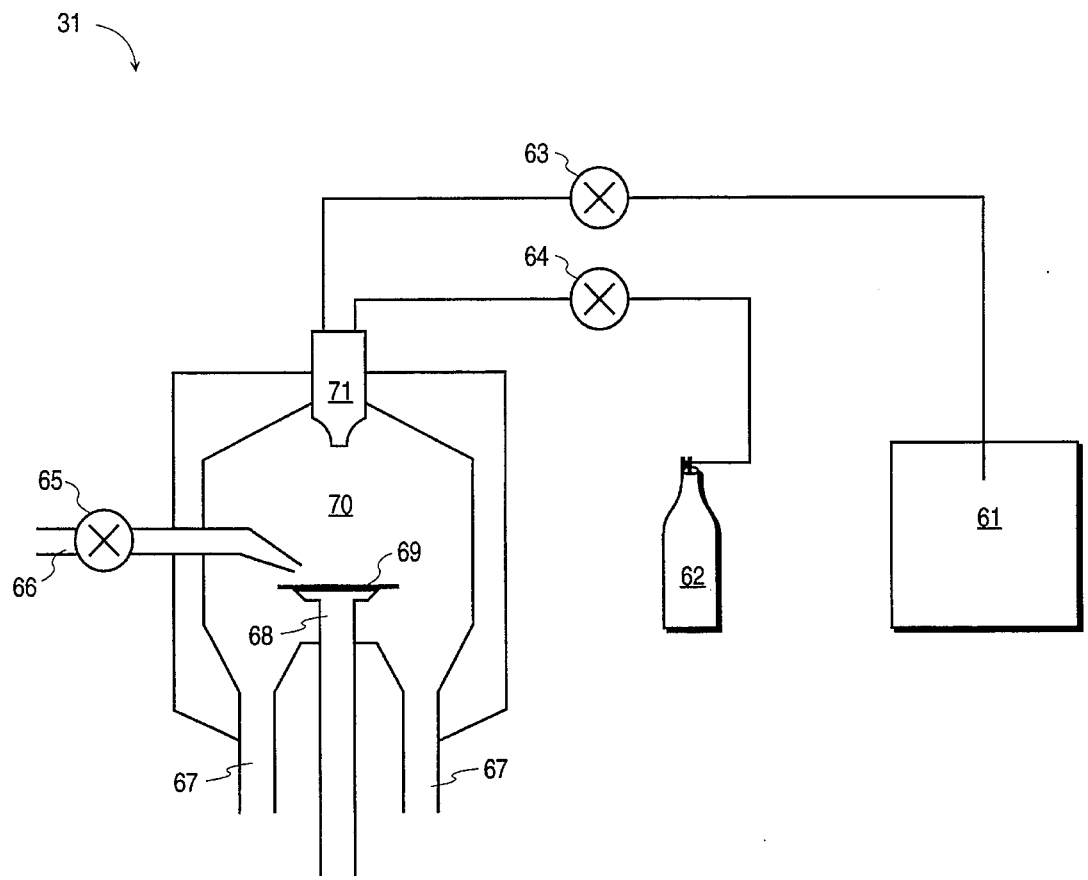
FIG. 3 provides a more detailed view of Block 31 of FIG. 1 including a cross-sectional view of a process chamber.

While a currently preferred embodiment of the present invention is illustrated in FIGS. 1–3, this illustration is not intended to limit the invention. The apparatus described herein is only meant to help clarify one's understanding of the disclosed process and to suggest a currently preferred embodiment of how this process may be implemented. The apparatus of FIG. 1 includes a robotic transport mechanism 30 to transport wafers between the dirty wafer cassette tray 33, the etching/cleaning chamber 32, the rinsing/oxidizing chamber 31, and the clean wafer cassette tray 34. By linking the modules in this fashion it is possible to place the entire process under computer control.

FIG. 2 represents a currently preferred embodiment of the etching/cleaning chamber 32 of FIG. 1. It includes an HCL/$H_2$O vaporizer 42, an HF/$H_2$O vaporizer 43, and a carrier gas source 41. The vaporizers contain azeotropic aqueous mixtures. An azeotropic mixture is a liquid mixture in which the relative composition of each of the mixture's components are such that the vapor produced by evaporation of the mixture has the same composition as the liquid mixture itself. The HCL/$H_2$O vaporizer 42 contains about 20.24 wt. % HCL and about 79.76 wt. % $H_2$O. The HF/$H_2$O vaporizer 43 contains about 37 wt. % HF and about 63 wt. % $H_2$O. The carrier gas may be any inert gas such as a noble gas or any other gas with does not hinder the etching/cleaning properties of the present invention. In a currently preferred embodiment of the present invention, nitrogen is used as the carrier gas.

Other vaporizers or source gases may be added to this basic system depending on the requirements of the user. For instance, one may wish to incorporate inter-halogen gases into the basic system. These and other gases may be added to enhance or improve the substrate etching/cleaning process or to clean the process chamber. Additionally, it may prove useful to attach the vaporizers necessary to emulate an RCA-type or choline clean in the vapor phase. It should be realized, however, that any additions to the basic system increases cost, complexity, and the risk of down-time to the process module.

In a currently preferred embodiment of the present invention, the HCL/$H_2O$ vaporizer 42 and the HF/$H_2O$ vaporizer 43 are maintained at a temperature of approximately 50° C., and the carrier gas flow through the vaporizers is maintained at a rate of approximately 1.25 standard liters per minute (slm). In alternate embodiments of the present invention, the temperature of the vaporizers may be maintained in the range of approximately 20°–100° C. The carrier gas flow through the vaporizers may be held at a rate in the range of approximately 0.1–20 slm. It is not necessary that both vaporizers be maintained at the same flow rate or temperature.

Under a currently preferred embodiment of the present invention, all the valves shown in FIG. 2 are placed under computer control. Valves 53 and 54 in FIG. 2 control the carrier gas flows into the HCL/$H_2O$ vaporizer 42 and the HF/$H_2O$ vaporizer 43 respectively. Valves 51 and 52 may be used to control the relative composition of HCL/$H_2O$ vapor to HF/$H_2O$ vapor that may be allowed to enter the chamber, or to entirely shut off the flow of one or the other vapors. Valve 44 controls the flow of the vaporous mixture through the injector nozzle 46 and into the process chamber 47. Valve 45 controls the flow of pure carrier gas through the injector nozzle 46 and into the process chamber 47. Valve 50 is the exhaust valve from the process chamber 47.

In a currently preferred embodiment of the present invention, a semiconductor substrate 48 is placed upon support pins 49 in the etching/cleaning process chamber 47. With valve 44 closed, valve 45 is opened to allow the carrier gas 41 to briefly purge the process chamber 47 until any residual process chamber 47 gases are flushed out. After purging, valve 45 is closed and the process chamber is pumped down to a pressure of approximately 37 Torr. In alternate embodiments of the present invention, the process chamber 47 may be maintained at a pressure in the range of approximately 1 mTorr to several atmospheres.

Next valve 44 is opened and the etching/cleaning process begins. In a currently preferred embodiment of the present invention, both the HCL/$H_2O$ vapor and the HF/$H_2O$ vapor enter the process chamber 47 at the same rate. However, as described above, in alternate embodiments of the present invention the vaporizer temperatures or carrier gas flow rates through the vaporizers may be independently adjusted to effectively adjust the relative composition of the vaporous ambient in the process chamber 47. Additionally, valves 51 and 52 may be used to more directly control the relative composition of the vaporous ambient. For instance, it may be necessary to entirely shut off the flow of one or more vapors that enters the process chamber 47.

In a preferred embodiment of the present invention, the injector nozzle 46 is held at an elevated temperature such as 60° C. in order to prevent the vapors from condensing at the nozzle. The semiconductor substrate remains at approximately room temperature and approximately atmospheric pressure while being exposed to the HCL/$H_2O$ and HF/$H_2O$ vapors for approximately 10 seconds before valve 44 is shut off. In alternate embodiments of the present invention, the Injector nozzle may be held at any temperature higher than the temperature of the incoming vapor while the process chamber 47 is held at a pressure in the range of approximately 1 mTorr to several atmospheres.

In alternate embodiments of the present invention, the semiconductor substrate may be cooled to a temperature in the range of approximately room temperature to 0° C. without greatly complicating the system. Finally, depending on the process temperatures, ambient pressure, ambient composition, and oxide layer thickness, the etching/cleaning time may vary in the range of approximately 1 second to 5 minutes.

FIG. 3 represents a currently preferred embodiment of the rinsing/oxidizing chamber 31 of FIG. 1. Its main components include an oxidizing ambient source 61, an inert gas source 62, and a process chamber 70. In a currently preferred embodiment, the oxidizing ambient source 61 is an ozonator capable of a 10 g/hr. maximum ozone output at an input oxygen flow rate of 500 liters/hour (l/hr). The inert gas 62 may be any of the noble gases or any other gas which does not hinder the rinsing/oxidizing properties of the present invention. In a currently preferred embodiment, nitrogen is used as the inert gas 62. The process chamber 70 includes some means for delivering a rinsing liquid 66 to the semiconductor substrate 69. The process chamber 70 also includes a rotating chuck 68 upon which the semiconductor substrate 69 rotates in order to insure uniform and complete rinsing and drying of the substrate surface.

Under a currently preferred embodiment of the present invention, a semiconductor substrate 69 is placed upon the chuck 68 in the process chamber 70 and the rinsing procedure begins. Valves 63 and 64 are closed. Valve 65 is opened and the semiconductor substrate is subjected to a steady stream of a rinsing solution as the chuck 68 rotates. In a currently preferred embodiment, the rinsing solution is de-ionized water (D.I.), but other solvents may be used. The rinsing solution is drained out of the process chamber 70 through drain holes 67. After rinsing, valve 65 is closed and valve 64 is opened. The semiconductor substrate 69 is then dried by blowing the inert gas 62 through the injector nozzle 71 and across the semiconductor substrate 69 as it spins.

Then the oxidizing procedure begins. Valve 64 is closed and valve 63 is opened to allow the oxidizing ambient to enter the process chamber. In a currently preferred embodiment of the present invention, ozone is used as the oxidizing ambient. The ozone flow rate into the chamber 70 is created by flowing oxygen through the ozonator 61 at a rate of approximately 3.5 slm. In alternate embodiments of the present invention, the oxygen flow rate through the ozonator may be in the range of approximately 0.1–20 slm.

In a currently preferred embodiment of the present invention, the semiconductor substrate 69 is exposed to the oxidizing ambient for approximately 60 seconds. Valve 64 is then opened while valve 63 is closed and the process chamber 70 is purged with the inert gas 62. This oxidizing process is carried out at approximately room temperature and approximately atmospheric pressure. In alternate embodiments of the present invention, the semiconductor substrate may be exposed to the oxidizing ambient for a length of time in the range of approximately 1 second to 5 minutes at a pressure in the range of approximately 1 mTorr to several atmospheres. As with the temperature ranges for the etching/cleaning process, the oxidation process may occur in the range of approximately room temperature to 100° C. without greatly complicating the system, room temperature to approximately 300° C. without causing significant impurity diffusion, or room temperature to approximately 1000° C. if diffusion is either inconsequential or necessary.

Figure 4:
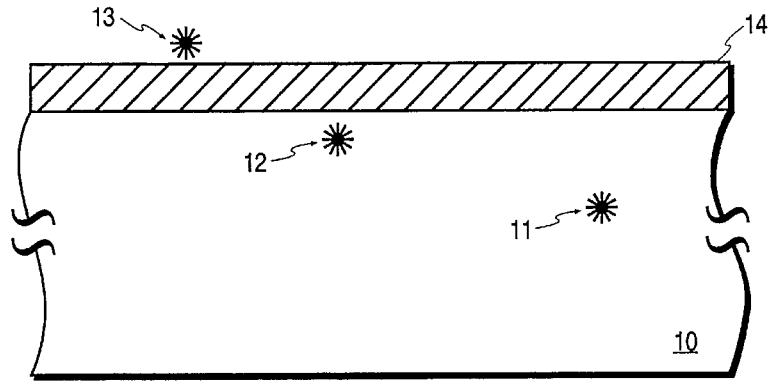
FIG. 4 is a cross-sectional view of a semiconductor layer with a native oxide layer at its surface.
Figure 5:
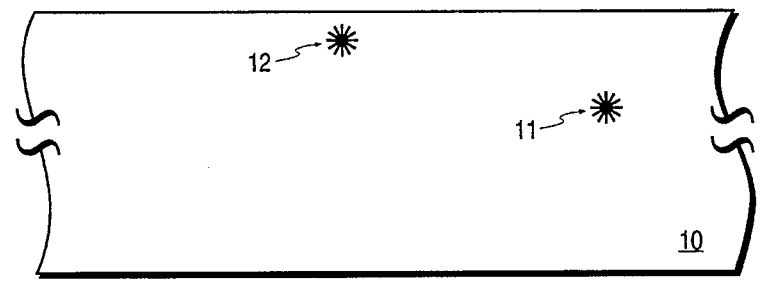
FIG. 5 shows the semiconductor layer of FIG. 4 after the native oxide layer has been removed.
Figure 6:
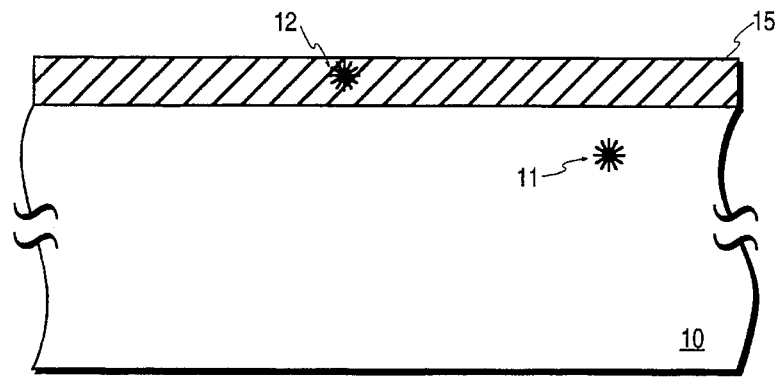
FIG. 6 shows the semiconductor layer of FIG. 5 after an oxide layer has been purposely grown at its surface.

A currently preferred embodiment of the present invention has been described in terms of the apparatus of FIG. 1. It is now necessary to examine how the present invention affects the semiconductor substrate. FIGS. 4–10 in conjunction with a currently preferred embodiment of the present invention as illustrated in the flow chart of FIG. 11 are not intended to limit the invention but rather to help clarify one's understanding of the disclosed process. FIGS. 4–10 are not necessarily to scale. FIG. 4 shows a "dirty" semiconductor layer 10. In a currently preferred embodiment of the present invention, the raw semiconductor material 10 comprises silicon or any other material which may be oxidized. An oxidized layer 14 is shown at the surface of semiconductor layer 10. This oxidized layer 14 may exist due to ambient oxidation of the semiconductor layer 10 or may have been purposely grown by a previous process step. FIG. 4 also shows the presence of microcontaminant 13 which may exist as part of a contaminant film. The asterisks labelled 11 and 12 are included to represent sub-surface impurities or perhaps defective lattice regions.

Referring now to the top of FIG. 11, In a currently preferred embodiment of the present invention the dirty wafer of FIG. 4 first undergoes the HCL/$H_2O$, HF/$H_2O$ etching/cleaning process as described above and illustrated in Block A of FIG. 11. This ambient vapor serves to etch the surface oxide layer 14 as well as complexes the surface contaminant 13. This etching/cleaning process has an extremely large selectivity of oxide over silicon, so the surface of the silicon layer 11 remains completely intact during the process. In an alternate embodiment of the present invention, in which one simply desires to etch a semiconductor substrate to a particular depth by oxidation and subsequent etching of the oxidized layer, an HF/$H_2O$ vapor may be used in absence of the HCL/$H_2O$ vapor to create a strictly etching ambient in place of the etching/cleaning ambient as described above.

Referring again to FIG. 11, it can be seen that the semiconductor layer of FIG. 4 then undergoes the rinsing and drying process as described above and illustrated in Block B of FIG. 11. The rinsing agent serves to remove any remaining non-volatile complexed contaminants 13 as well as any by-products of the oxide etching reaction. After the semiconductor layer 10 is dried according to the process as described above, it emerges as illustrated in FIG. 5.

It now becomes necessary to accurately remove surface layers of the semiconductor layer 10 in order to eliminate the sub-surface impurities or lattice defects 11 and 12. Block C of FIG. 11 illustrates the oxidation process to semiconductor layer 10 as described above. The newly oxidized layer 15 is shown in the cross-section of FIG. 6. In a currently preferred embodiment where ozone is used to oxidize the surface of the silicon layer 10 at room temperature and atmospheric pressure, approximately 7 Å of oxide will form at the silicon surface. Thus approximately 3 Å of silicon will be consumed in the process. This is a self-limiting ozone and silicon reaction such that approximately 3 Å of silicon will be consumed every time the oxide is grown at the silicon surface regardless of minor fluctuations in silicon exposure time. In alternate embodiments of the present invention, parameters of the oxidizing ambient such as temperature, pressure, and composition may be adjusted such that an oxide layer thickness in the range of approximately 2–200 Å is grown. For instance, an increase in temperature and pressure will increase the oxide layer thickness, but may, however, also cause unwanted diffusion of the contaminants.

Figure 7:
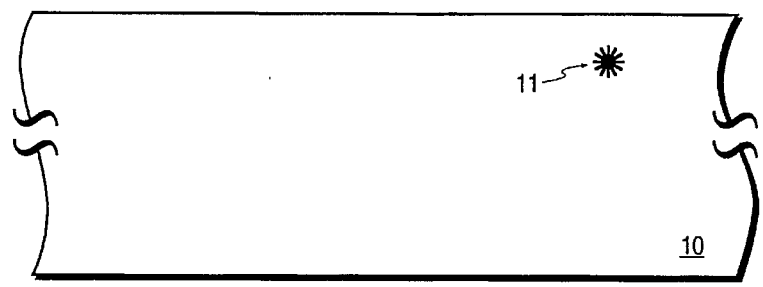
FIG. 7 shows the semiconductor layer of FIG. 6 after the purposely grown oxide layer has been removed.
Figure 8:
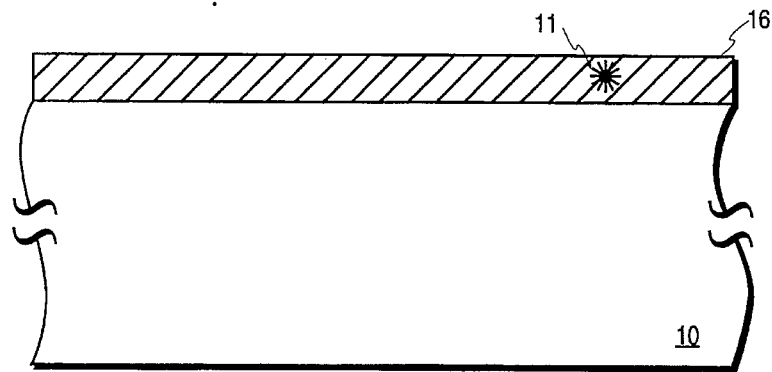
FIG. 8 shows the semiconductor layer of FIG. 7 after another oxide layer has been purposely grown at its surface.
Figure 9:
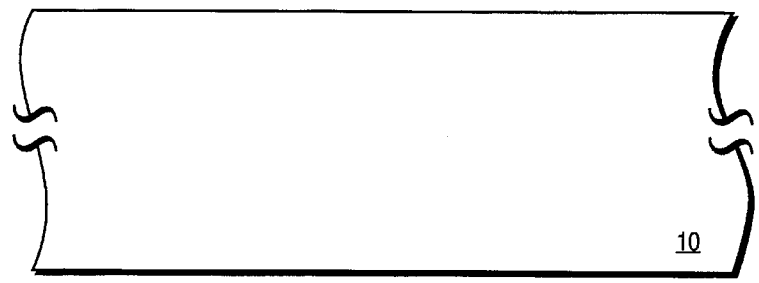
FIG. 9 shows the semiconductor layer of FIG. 8 after the purposely grown oxide layer has been removed.

As can be seen in the flow chart of FIG. 11, the semiconductor layer may again be exposed to the HCL/$H_2O$, HF/$H_2O$ etching/cleaning ambient in order to etch the oxide layer 15 and remove the defect or impurity 12. After rinsing and drying, the impurity or defect 12 has been removed leaving the cross-section as illustrated in FIG. 7. The process is again repeated beginning with growing the oxide layer 16 as shown in FIG. 8, then etching/cleaning, then rinsing, then drying to remove the impurity or defect 11 resulting in the cross-section illustrated in FIG. 9. The process sequence may be repeated any number of times depending on the depth of the defect or impurity below the surface of the semiconductor substrate 10. With each iteration of the oxidation-etching/cleaning-rinsing/drying sequence, a controlled, repeatable amount of the surface of the semiconductor substrate 10 is consumed. In a currently preferred embodiment of the present invention, 3 Å of silicon are consumed with each iteration.

Figure 10:
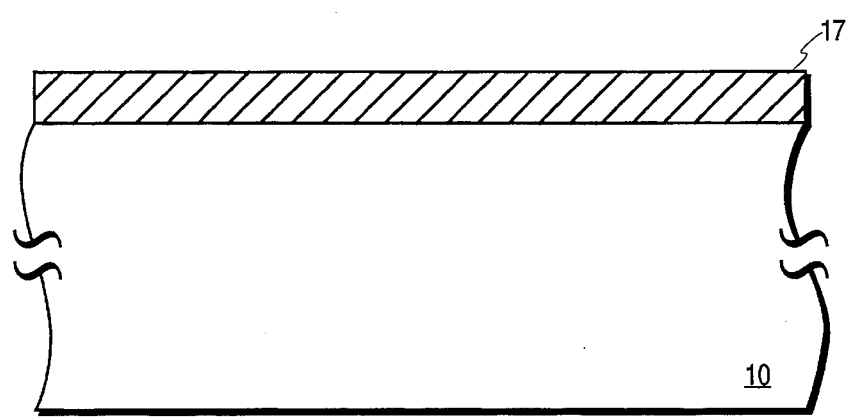
FIG. 10 shows the semiconductor layer of FIG. 9 after another oxide layer has been purposely grown at its surface.
Figure 11:
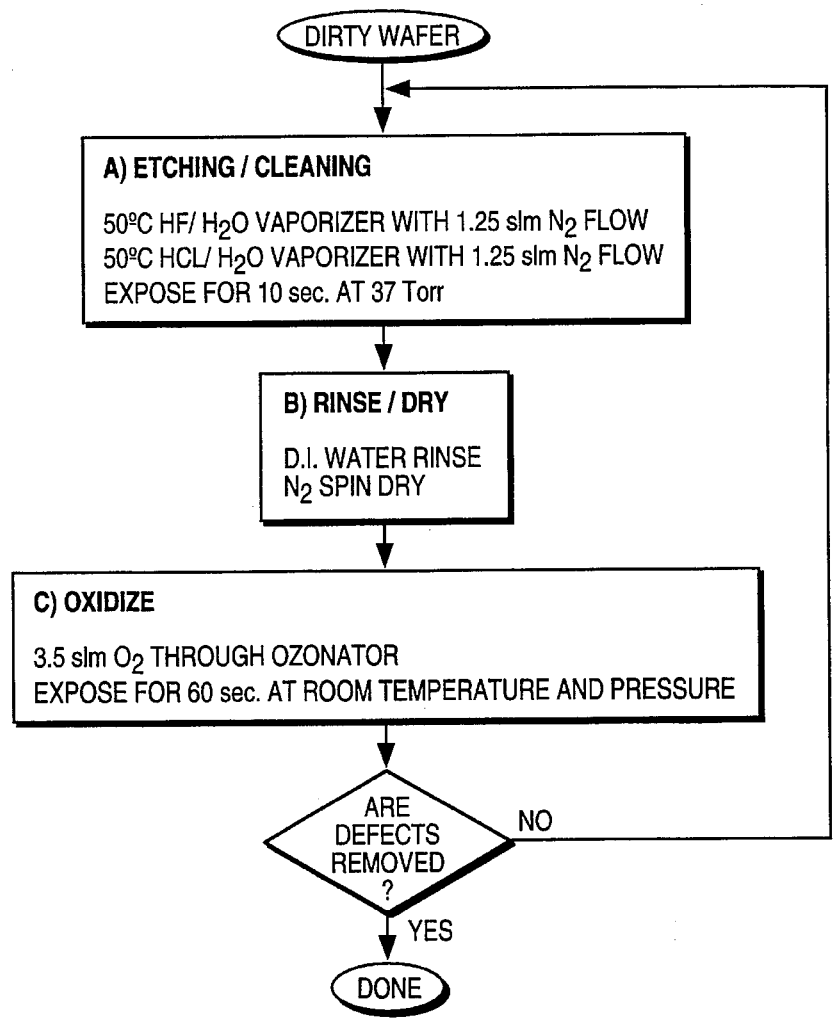
FIG. 11 shows a flow chart representing an embodiment of the present invention.

As can be seen in the flow chart of FIG. 11 and the cross-section of FIG. 10, A currently preferred embodiment of the present invention leaves a thin, passivating oxide layer on the surface of the semiconductor layer 10 before the entire process is considered complete. This final oxide layer serves as protection from the microcontamination that may be introduced during subsequent semiconductor transport or processing. In alternate embodiments of the present invention, this final oxide layer need not be grown in order to consider the process sequence complete. In another embodiment, the Rinse & Dry step of Block B of FIG. 11 is not performed upon completion of the etching/cleaning process in order to consider the process sequence complete. This embodiment could be used, for example, where subsequent process steps serve the same purpose. In further embodiments of the present invention, the rinsing and drying portion of the process sequence as represented by Block B of FIG. 11 in each iteration of the process sequence can be eliminated depending on the requirements of the user.

The method of cleaning semiconductor materials utilizing the present invention is very simple in that it does not require complex equipment such as high-vacuum pumps or plasma generating equipment. The present invention can proceed at room temperature making it useful for low thermal budget processes in ULSI manufacturing as well as preventing the inadvertent diffusion of trace contaminants deeper into the semiconductor material. The present invention, because it is carried out almost entirely in a gaseous ambient, makes it much cleaner than its aqueous chemical counterparts such as the RCA clean. The micro-smoothness of the semiconductor surface is not appreciably degraded by the present invention when compared to either the RCA clean or the UV/$CL_2$ process. Finally, in a preferred embodiment of the present invention, the oxide growth process is self-limiting allowing for the consistent removal of controlled amounts of silicon with each iteration of the process.

Thus, an ultra-clean, high precision process for not only removing contaminants from the surface and sub-surface of semiconductor layers and substrates but also etching very thin layers of semiconductor material has been described. This process is capable of supporting the stringent ULSI manufacturing demands of the future.

What is claimed is:

1. A process for treating a semiconductor layer to remove contaminants and impurities therein, comprising the steps of:

a) oxidizing at least a portion of said semiconductor layer in a gaseous first ambient comprising ozone, said first ambient being oxidizing, to form an oxidized layer, wherein a portion of said semiconductor layer is consumed; and b) etching at least a portion of said oxidized layer in a second ambient, said second ambient being gaseous, to expose a surface;

wherein said semiconductor layer is maintained in an absence of UV radiation and at a temperature within a range of approximately room temperature to 300° C. during and between steps a and b.

2. The process as defined by claim 1 wherein steps a and b are performed a plurality of times.

3. The process as defined by claim 2 wherein either of steps a or b is performed at a temperature in the range of approximately 20°–100° C.

4. The process as defined by claim 1 wherein said second ambient is selected from the group consisting of: HF, HCl, and any combination thereof.

5. The process as defined by claim 1 wherein any of steps a or b is performed at a temperature in the range of approximately 20°–100° C.

6. The process as defined by claim 1 wherein metal contaminants existing on said surface upon completion of step b are subsequently removed.

7. The process as defined by claim 1 wherein said oxidized layer has a thickness in the range of approximately 2–200 Angstroms.

8. A process for treating a semiconductor layer comprising the steps of:

a) oxidizing at least a portion of said semiconductor layer in a first ambient, said first ambient being oxidizing, to form an oxidized layer; and b) etching at least a portion of said oxidized layer in a second ambient, said second ambient being gaseous, to expose a surface;

wherein steps a and b are performed a plurality of times and said semiconductor layer is maintained in an absence of UV radiation and at a temperature within a range of approximately room temperature to 300° C. during and between steps a and b.

9. The process as defined by claim 8 wherein said second ambient is selected from the group consisting of: HF, HCl, and any combination thereof.

10. The process as defined by claim 9 wherein said second ambient further comprises an inert carrier gas selected from the group consisting of nitrogen, argon, or any combination thereof.

11. The process as defined by claim 8 wherein any of steps a or b is performed at approximately room temperature.

12. A process for treating a semiconductor layer to remove contaminants and impurities therein, comprising the steps of:

a) oxidizing at least a portion of said semiconductor layer in a first ambient comprising ozone, said first ambient being oxidizing, to form an oxidized layer, wherein a portion of said semiconductor layer is consumed; and b) etching at least a portion of said oxidized layer in a second ambient wherein said second ambient is selected from the group consisting of HCl, HF, and any combination thereof, said second ambient being gaseous, to expose a surface;

wherein said semiconductor layer is maintained in an absence of UV radiation and at a temperature within a range of approximately room temperature to 100° C. during and between steps a and b.

13. The process as defined by claim 12 wherein said second ambient further comprises an inert carrier gas selected from the group consisting of nitrogen, argon, helium, or any combination thereof.

14. The process as defined by claim 13 wherein any of steps a or b is performed at approximately room temperature.

15. The process as defined by claim 14 wherein metal contaminants existing on said surface upon completion of step b are subsequently removed.

16. The process as defined by claim 15 wherein said metal contaminants are removed by a method comprising rinsing with DI water.

17. The process as defined by claim 13 wherein said second ambient is generated and maintained by flowing a first flow of said inert carrier gas through a first vaporizer containing an azeotropic mixture comprising HF and water, and by flowing a second flow of said inert carrier gas through a second azeotropic mixture comprising HCL and water.

18. The process as defined by claim 12 wherein steps a and b are performed a plurality of times.

19. A process for treating a semiconductor layer to remove contaminants and impurities therein, comprising the steps of:

a) oxidizing at least a portion of said semiconductor layer in a first ambient comprising ozone, said first ambient being oxidizing, to form an oxidized layer, wherein a portion of said semiconductor layer is consumed; and b) etching at least a portion of said oxidized layer in a second ambient, said second ambient being gaseous, to expose a surface;

wherein said semiconductor layer is maintained in an absence of UV radiation and at a temperature in the range of approximately 20°–100° C. during and between steps a and b.

20. The process as defined by claim 19 wherein steps a and b are performed a plurality of times.

21. A process for treating a semiconductor layer to remove contaminants and impurities therein, comprising the steps of:

a) oxidizing at least a portion of said semiconductor layer in a first ambient comprising ozone, said first ambient being oxidizing, to form an oxidized layer, wherein said oxidized layer has a thickness in the range of approximately 2–200 Angstroms; and b) etching at least a portion of said oxidized layer in a second ambient, said second ambient being gaseous and said oxidized layer being at approximately room temperature, to expose a surface;

wherein said semiconductor layer is maintained in an absence of UV radiation and at approximately room temperature during and between steps a and b.

22. The process as defined by claim 21 wherein steps a and b are performed a plurality of times.

23. A process for treating a silicon layer or a silicon substrate to remove contaminants and impurities therein, comprising the steps of:

a) oxidizing at least a portion of said silicon layer or silicon substrate at approximately room temperature in a first ambient, said first ambient comprising ozone, to form an oxidized layer, wherein a portion of said silicon layer or silicon substrate is consumed;

b) etching at least a portion of said oxidized layer in a second ambient, said second ambient being gaseous and said second ambient is selected from the group consisting of: HF, HCl, and any combination thereof, to expose a surface; and c) removing metal contaminants from said surface by a method comprising rinsing with DI water;

wherein said silicon layer or silicon substrate is maintained in an absence of UV radiation and at approximately room temperature during and between steps a, b, and c.

24. The process as defined by claim 23 wherein steps a or b are performed a plurality of times.

25. The process as defined by claim 24 wherein said second ambient further comprises an inert carrier gas selected from the group consisting of nitrogen, argon, helium, or any combination thereof.

26. The process as defined by claim 23 wherein said second ambient further comprises an inert carrier gas selected from the group consisting of nitrogen, argon, helium, or any combination thereof.

27. The process as defined by claim 26 wherein said second ambient is generated by flowing a first flow of said inert carrier gas through a first vaporizer containing and azeotropic mixture comprising HF and water, and by flowing a second flow or said inert carrier gas through a second azeotropic mixture comprising HCL and water.

28. The process as defined by claim 27 wherein said inert carrier gas flows through said first and said second vaporizers at a rate in the range of approximately 0.1–20 slm.

29. The process as defined by claim 23 wherein said oxidized layer has a thickness in the range of approximately 2–200 Angstroms.

* * * * *

UNITED STATES PATENT AND TRADEMARK OFFICE
CERTIFICATE OF CORRECTION

PATENT NO. : 5,589,422
DATED : December 31, 1996
INVENTOR(S) : Suresh A. Bhat It is certified that error appears in the above-identified patent and that said Letters Patent is hereby corrected as shown below:

In column 2 at line 52 delete "stub-surface" and insert --sub-surface--

Signed and Sealed this

Twenty-second Day of April, 1997

*Attest:*

BRUCE LEHMAN

*Commissioner of Patents and Trademarks*

*Attesting Officer*